United States Patent
Gandhi et al.

(10) Patent No.: US 8,416,893 B2
(45) Date of Patent: Apr. 9, 2013

(54) SYSTEMS AND METHODS OF IMPROVED POWER AMPLIFIER EFFICIENCY THROUGH ADJUSTMENTS IN CREST FACTOR REDUCTION

(75) Inventors: Hardik Prakash Gandhi, Mountain View, CA (US); Zigang Yang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 99 days.

(21) Appl. No.: 12/957,278

(22) Filed: Nov. 30, 2010

(65) Prior Publication Data

US 2012/0134399 A1    May 31, 2012

(51) Int. Cl.
*H04L 27/08*    (2006.01)
(52) U.S. Cl. ........ 375/345; 375/224; 375/260; 375/262; 375/267; 375/316
(58) Field of Classification Search .................. 375/226, 375/229, 346, 260, 262, 267, 340, 343, 345, 375/347; 370/203, 204, 205, 208, 209, 210
See application file for complete search history.

(56) References Cited

U.S. PATENT DOCUMENTS

| | | | |
|---|---|---|---|
| 7,103,029 B1 * | 9/2006 | Minowa | 370/342 |
| 7,684,771 B2 * | 3/2010 | Blair et al. | 455/127.1 |
| 7,697,591 B2 | 4/2010 | Copeland | |
| 7,783,260 B2 * | 8/2010 | McCallister et al. | 375/227 |
| 2006/0222118 A1 * | 10/2006 | Murthy et al. | 375/345 |
| 2012/0020429 A1 * | 1/2012 | Peroulas et al. | 375/295 |

OTHER PUBLICATIONS

U.S. Appl. No. 12/342,310, filed Dec. 23, 2008.

* cited by examiner

*Primary Examiner* — Dhaval Patel
(74) *Attorney, Agent, or Firm* — Alan A. R. Cooper; Wade J. Brady, III; Frederick J. Telecky, Jr.

(57) ABSTRACT

Crest factor reduction algorithms described herein may be used to improve power amplifier efficiency during low signal power conditions compared to traditional static threshold techniques. Techniques described herein insure that the signal power level at the output of the crest fact reduction block is held constant relative to the input power level under all signal power level conditions. Two different solutions may be implemented together or separately to achieve the desired conditions. The first technique provides constant ratio between input power and output power. Constant ratio of peak and average output levels keeps the amount of crest factor reduction applied to the signal constant, irrespective of the signal power level. A second technique is to hold signal power level constant in respect to the amount of crest factor reduction applied.

11 Claims, 3 Drawing Sheets

SYSTEMS AND METHODS OF IMPROVED POWER AMPLIFIER EFFICIENCY THROUGH ADJUSTMENTS IN CREST FACTOR REDUCTION

TECHNICAL FIELD

The present disclosure is generally related to electronics and, more particularly, is related to power amplifiers.

BACKGROUND

Various wireless communication systems are known. Higher order modulation wireless signals such as those used in CDMA (Code Division Multiple Access) or OFDM (Orthogonal Frequency Division Multiplexing) based communication systems have a high Peak to Average signal power Ratio (PAR). The higher peaks require the communication system to operate a Power Amplifier (PA) used to transmit the signal at less than an optimal power level because the higher signal peaks can cause the PA to max-out or saturate. To allow the power amplifier for a communication system to be driven harder and more efficiently, the peak to average ratio of the transmitted signals should be reduced while preserving the other characteristics of the signal such as modulation accuracy and spectral mask requirements.

Digital PAR reduction techniques typically involve injecting noise into the signal to cancel out the time domain signal peaks, thereby reducing the PAR. Traditionally, finite impulse response (FIR) filters are used to spectrally shape the cancellation noise before applying the cancellation noise to the signal; one such approach to using an FIR filter to reduce PAR includes that described in U.S. patent application Ser. No. 10/643,179, filed Aug. 18, 2003, published as U.S. 2004/0052314, which is incorporated herein by reference. By so shaping the cancellation noise, spectral re-growth of the signal is prevented. The FIR filter should match the instantaneous spectrum of the composite multicarrier signal typical of transmit systems, otherwise mismatch between the time domain profiles of the signal peaks and the cancellation noise reduces the peak cancellation efficiency.

SUMMARY

Example embodiments of the present disclosure provide systems of improved power amplifier efficiency through adjustments in crest factor reduction (CFR). Briefly described, in architecture, one example embodiment of the system, among others, can be implemented as follows: an input magnitude module configured to determine a magnitude of an input to a crest factor reduction (CFR) module; and at least one of: an automatic gain control (AGC) circuit configured to automatically amplify an output of the CFR module based on the magnitude of the input of the CFR module as measured by the input magnitude module and the magnitude of the output of the CFR module; and a dynamic threshold module configured to maintain a substantially fixed ratio between a peak threshold power of the input of the CFR module and an average power of the input of the CFR module.

Embodiments of the present disclosure can also be viewed as providing methods of improved power amplifier efficiency through adjustments in crest factor reduction (CFR). In this regard, one embodiment of such a method, among others, can be broadly summarized by the following steps: receiving an input to a crest factor reduction (CFR) module; and at least one of: automatically amplifying the output of the CFR module to maintain a substantially constant input to output ratio for the CFR module; and maintaining a substantially constant ratio between a peak output power and an average output power of the CFR module.

DETAILED DESCRIPTION

Figure 1:
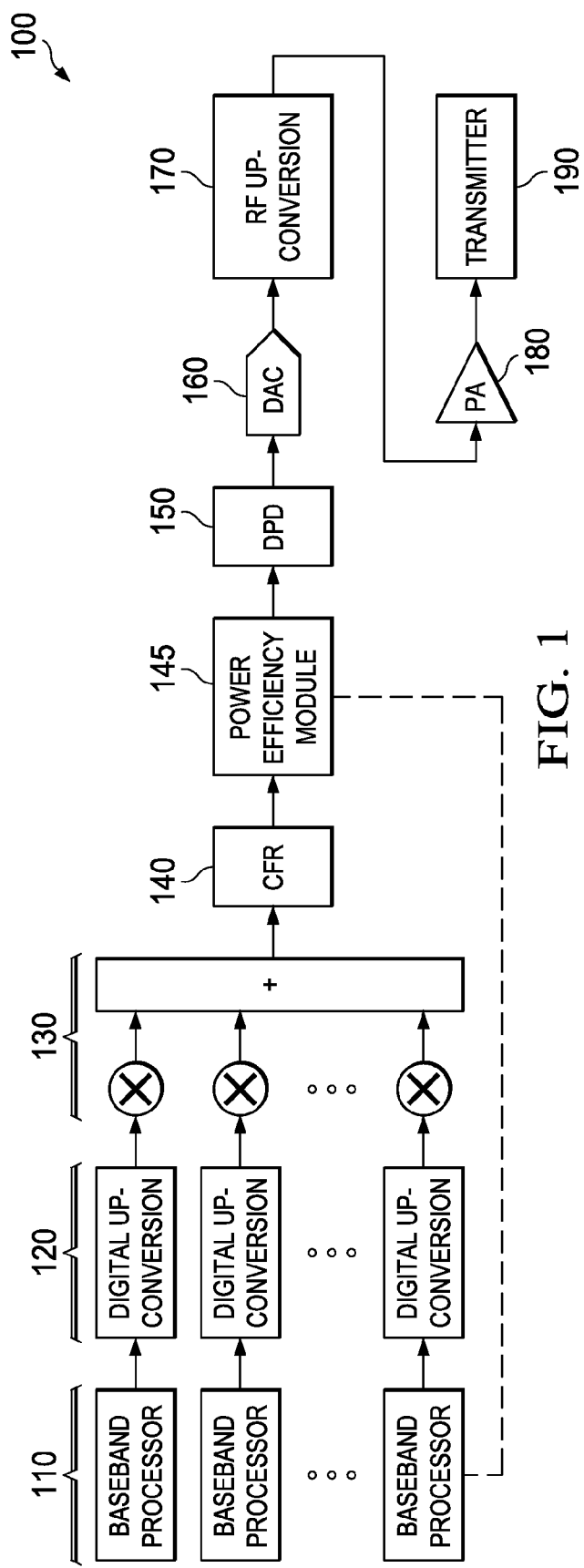
FIG. 1 is a block diagram of an example of a signal processing stream for a communication signal.

Refer now to the drawings wherein depicted elements are, for the sake of clarity, not necessarily shown to scale and wherein like or similar elements are designated by the same reference numeral through the several views.

Traditional crest factor reduction algorithms may be used to improve power amplifier efficiency and linearity by reducing the peak average power ratios of communication signals aimed to restrict the signal peak power levels below a predetermined threshold, based on the peak power level that can be tolerated at the power amplifier. When the signal RMS power level drops due to reduced communication traffic, the amount of crest factor reduction applied reduces because the static peak threshold and the peak signal power levels still remain relatively large. By dynamically changing the peak threshold such that it is always set to a fixed ratio with respect to the signal RMS power level the PAR of the signal may be regulated to be substantially constant under all signal RMS power level conditions. This improves power amplifier efficiency during low signal power conditions compared to traditional static threshold techniques. For power amplifier topologies with dynamically adjusted PA drain voltages, dynamically adjusting the CFR thresholds to maintain a constant PAR assists in exercising the PA non-linearity more uniformly and provide better adjacent channel leakage ratio (ACLR) and overall error vector magnitude (EVM).

A secondary effect of holding the power amplifier (PA) power threshold stationary is that the transmit signal power levels vary a bit depending on the amount of crest factor reduction applied. As the signal power level drops due to drops in communication traffic, the amount of crest factor reduction decreases which in turn reduces the amount of variation in the signal power level due to the crest factor reduction operation. At higher signal power levels the amount of crest factor reduction increases, increasing the variation and signal power level. Depending on the signal type and threshold selected, there may be as much as one dB signal power variation between the input & output of the crest factor reduction processing across the range of signal transmit powers. The technique described in this disclosure compensates for this variation and insures that the signal power level at the output of the crest fact reduction block is held constant relative to the input power level under all signal power level conditions.

Two different solutions may be implemented together or separately to achieve the desired conditions. In the first solution, to improve power amplifier efficiency under reduced signal power level conditions, the crest factor reduction peak power threshold is dynamically adjusted based on signal power level. The amount of crest factor reduction that is the signal peak to the average power ratio may be held constant irrespective of the signal power levels. So at low signal power levels this technique would provide lower signal peak power levels improving the PA efficiency. The modulation accuracy, or error vector magnitude (EVM), which depends on the amount of crest factor reduction applied, is held constant in this proposed technique. Dynamically adjusting thresholds to match signal power level allows the PA non-linearity to be exercised to a limited range over varying operating conditions, which in turn limits how much spectral distortion is generated and hold modulation accuracy constant. In the traditional static threshold techniques, the amount of crest factor reduction decreases at reduced signal power levels, which in turn improves EVM. The technique disclosed herein provides for flexibility to trade off EVM improvement for PA power efficiency improvement. The proposed technique involves detecting the CFR input signal power level over predetermined time slots in the signal & then updating the threshold settings from a lookup table based on the power measurement results.

A second technique is to hold signal power level constant in respect to the amount of crest factor reduction applied. The first technique provides constant ratio between input power and output power. Constant ratio of peak and average output levels keeps the amount of crest factor reduction applied to the signal constant, irrespective of the signal power level so the CFR output signal power level is at a substantially constant ratio to the CFR power level. However, this requires a tradeoff between improved EVM verses an improved power efficiency. If the system application requires improved EVM to be more important than holding a signal power level constant, an automatic gain control circuit may be used to hold the relative signal power level constant in the presence of varying amounts of crest factor reduction.

This proposed solution involves a continuous signal power level measurement at the CFR input and output, a look up table to compute the amount of power level adjustment to be provided based on the power measurements, a programmable counter to determine the integration times for the power measurement and frequency of threshold updating, and a gain multiplier of the signal path after CFR. These solutions may provide improved power amplifier power efficiency in the presence of crest factor reduction at lower signal power levels. They may provide a method of holding relative transmit signal power level constant in the presence of variations in signal power levels in varying amounts of crest factor reduction. They may also provide for a way to apply different amounts of crest factor reduction to different time slots in a communication signal frame.

For example, for a Wimax OFDM signal, the module can apply different levels of CFR on the pilot or preamble slots verses the data slots. The AGC module may be positioned at the output of the CFR module to maintain the same RMS level between the CFR input & output signals. Mathematically, the AGC gain may be computed to compensate for the RMS difference between the CFR input & the CFR output. To reduce the computational complexity, the RMS value may be approximated as a running average of the magnitude. The RMS value may be averaged for each CFR input sample & CFR output sample however the gain may be calculated and updated every N samples, where N is the number of samples. A previous adapted AGC gain may be used initially and a new adapted AGC gain may be applied every N samples. At the time of power on of the system, a static gain may be used and an example embodiment to achieve smooth transition periods the adaptive gain may be calculated if the average CFR input and output power are both within the range of a preset threshold.

The dynamic threshold module enables the CFR to use different thresholds for different time slots in a signal. Two modes of operation may be used. In a sync based mode, a set of thresholds, for example, eight different thresholds, may be programmed for different time intervals in a data frame. On every synchronization event, a different threshold may be selected for use in a CFR module. This mode can be used in applications such as TDSCDMA or in clipping preamble/midamble/pilot/data sections of the signal stream to different peak power levels.

A second mode is a power comparator based mode in which the signal power at the CFR input is used to automatically update thresholds so that the CFR module operates in a constant PAR mode instead of a constant peak power mode. A constant peak-to-average power (PAR) CFR mode improves power amplifier efficiency by reducing the signal peaks under back off conditions and allows PA stages to be turned off once signal power drops. The AGC module running average determination or results may be used as inputs to the power comparator logic. Alternatively a power meter may be added on a per antenna basis to generate a composite power meter reading for the CFR inputs. In either case the power measurement results may be sent through a programmable shifter to select the appropriate number of bits for comparison. A set of programmable power thresholds may be sent in an example embodiment. The power meter results may be sequentially compared against those power thresholds.

In FIG. 1, a signal processing system 100 is shown. As shown, there are a baseband processors 110 that can each create a digital baseband communication signal. Each baseband signal is passed to a digital up-conversion circuit 120 that converts the digital baseband signal into an over-sampled signal. The over-sampled signals are provided to a digital mixer circuit 130 (which, as shown, includes mixers and a summing circuit) that combines the over-sampled signals into a single composite input signal. The composite input signal is provided to a crest factor reduction (CFR) circuit or module 140 that reduces some of the signal peaks relative to the average power of the input signal. The output of the crest factor reduction circuit 140 is provided to a power efficiency module 145. The output of power efficiency module 145 is provided to a digital pre-distortion (DPD) circuit 150. The DPD circuit 150 conditions the signal to increase the transmission efficiency of the signal. The DPD signal is provided to a digital to analog converter circuit 160. The analog signal provided by the digital to analog converter circuit 150 is provided to an RF up-conversion circuit 170 that adjusts the frequency of the analog signal for transmission. The up-converted analog signal is provided to a power amplifier 180 that amplifies the signal for transmission by a transmitter 190. The transmitter 190 may send the communication signal either wirelessly or through a wired connection.

Figure 2:
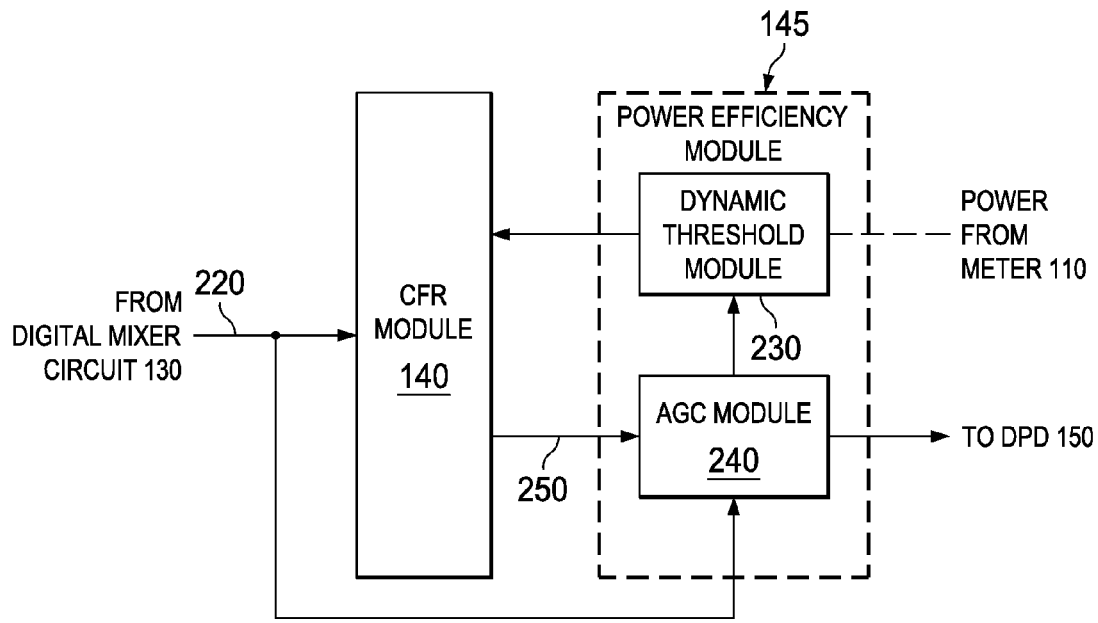
FIG. 2 is a block diagram of an example embodiment of a system of improved power amplifier efficiency through adjustments in crest factor reduction (CFR).
Figure 3:
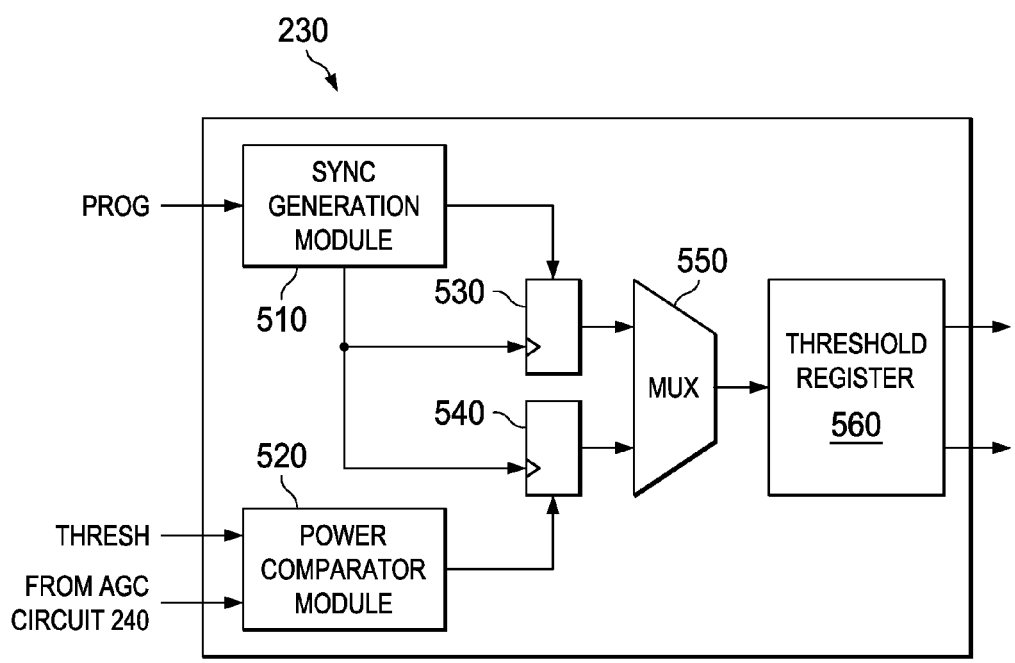
FIG. 3 is a block diagram of an example of the dynamic threshold module of FIG. 2.
Figure 4:
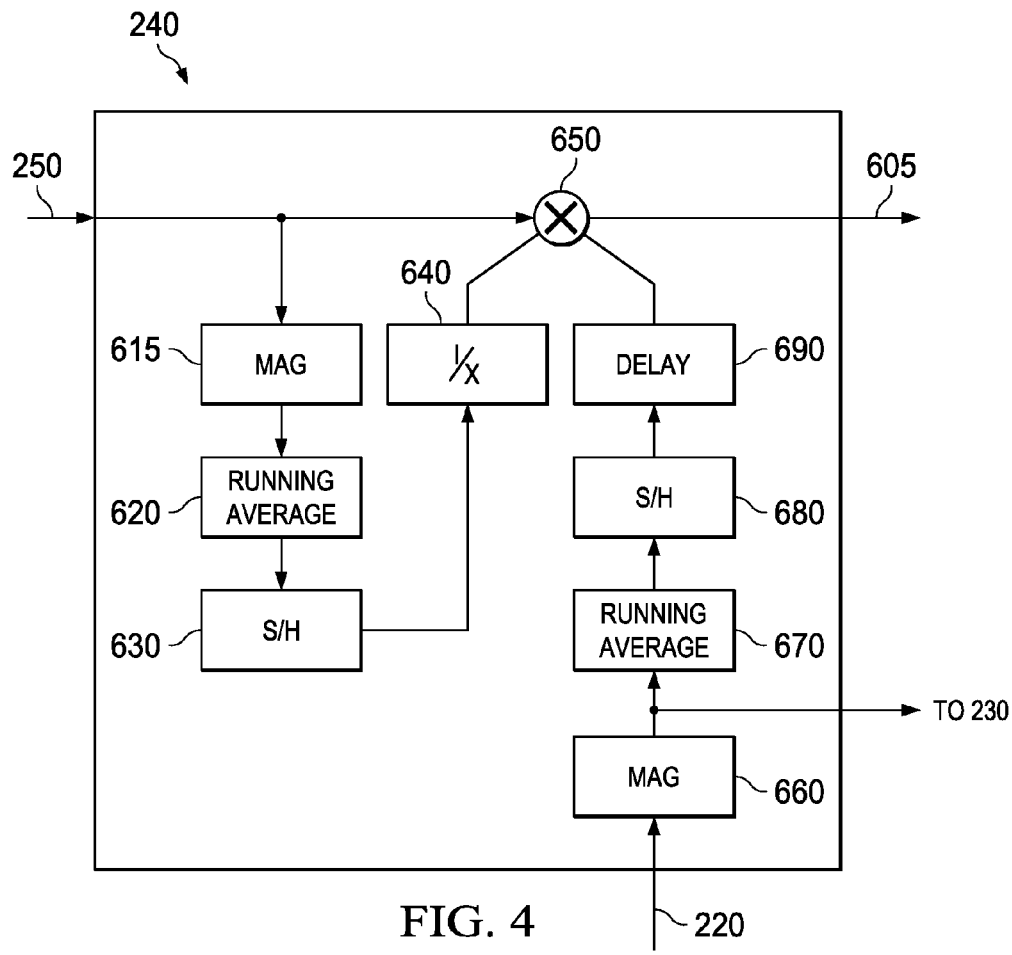
FIG. 4 is a block diagram of an example embodiment of the automatic gain control module of the system of FIG. 2.

An example power efficiency module 145 can be seen in FIG. 2 in greater detail. Power efficiency module 145 monitors the power levels of input 220 (which can receive the composite input signal that is output from circuit 130) and output 250 of CFR module 210. Power efficiency module 145 may comprise one or both of dynamic threshold module 230 and AGC module 240. As shown, the dynamic threshold module 230 interfaces with CFR circuit or module 140.

Dynamic threshold module 230 receives the magnitude of the input to CFR module 140 (through, for example, the AGC module or circuit 240) and selects a value based on that input magnitude. This value (which is selected by the dynamic threshold module or circuit 230) may be determined from a lookup table, and this value may then be forwarded to CFR module 140 for use, for example, in a peak gain estimation. For example, the value sent to CFR module 140 is used to keep the PAR substantially constant. AGC module 240, as shown in this example, receives both the input and output magnitude values of CFR module 140 through input 220 and output 250. AGC module 240 then amplifies the output of CFR module 140 such that the output stays at a substantially constant power level.

Figure 5:
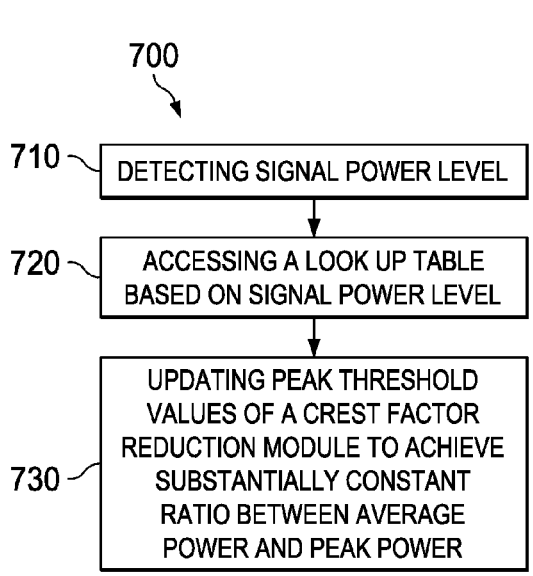
FIG. 5 is a flow diagram of an example embodiment of a method of adjusting crest factor reduction with dynamic threshold adjustments.

Turning to FIG. 5, an example of dynamic threshold module 230 can be seen in greater detail. Sync generation module 510 can be used for a sync-based mode in which, for example, eight different thresholds may be programmed (with signal PROG) for different time intervals in a data frame. On every sync event, a different threshold may be selected for use in the CFR module 140. This mode can be used in applications such as TDSCDMA or CDMA in which clipping the preamble/midamble/pilot/data sections of the signal stream is useful for different peak power levels. A sync generation module 510 may be used to generate the sync signal to indicate times at which thresholds may be changed and may also generate a 3 bit, for example, mapping signal to indicate which of the set of threshold registers may be used for the next time interval. Registers 530 and 540 are used to latch in and store the outputs of previous blocks at specified times. Power comparator module 520 selects a threshold level (e.g., from signal THRESH) where the thresholds can be automatically updated so that the CFR module 140 operates in a constant PAR mode instead of a constant peak power mode. A constant PAR CFR module (e.g., 140) may improve power amplifier efficiency by reducing the signal peaks under back off conditions. It allows PA stages (e.g., 180) to be turned off when signal power drops. Inputs to comparator logic in module 520 may use the average power meter results from the AGC module 240.

Alternatively, the base band block (e.g., baseband processors 110) may contain power meter measurements which may be added up on a per-antenna basis, for example, to generate a composite power meter reading for the CFR inputs (e.g., from AGC circuit 240). These power measurement results may be sent through a programmable shifter in module 520 to select the appropriate bits for comparison, in an example embodiment. A set of programmable power thresholds may also be set. By setting the threshold appropriately, an appropriate threshold value may be set for different ranges of input power meter results. Module 520 may be configured with a control bit to enable the outputs to change the thresholds automatically or, alternatively, at events defined by the sync signal. Multiplexer 550 accepts inputs from registers 530 and 540.

Threshold register 560, in this example, may store sets of thresholds of which a subset may be detection and another subset may be peak for each of two antenna streams. Threshold register 560 may be double buffered to enable taking thresholds on the fly. Each threshold may be 16 bits in an example embodiment. Whenever the address from module 550 changes, a pulse may be sent to the CFR module 140 as a threshold signal to update the threshold. For example, the CFR module 140 may accept threshold lines and a swap threshold signal, and, as another example, every time a threshold register 560 is to be accessed, a new threshold may be uploaded based on the swap threshold signal.

Figure 6:
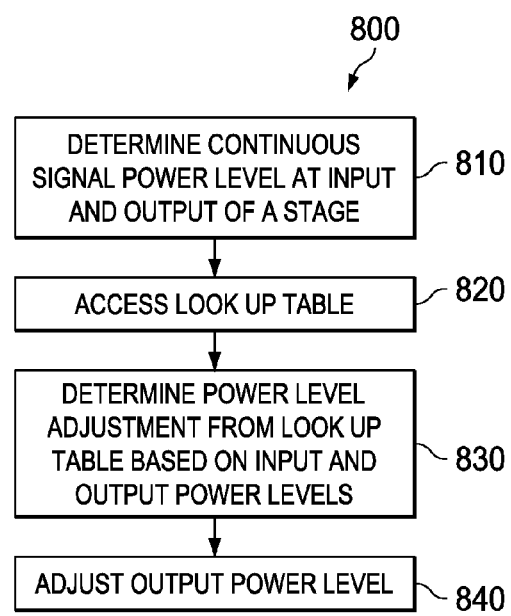
FIG. 6 is a flow diagram of an example embodiment of a method of adjusting crest factor reduction with automatic gain control.

FIG. 6 provides block diagram 600 of an example of AGC module 240. AGC module 240 may be placed at the output of a CFR module 140 to maintain the same RMS level between the CFR input and output signals (e.g., from 220 and 250, respectively). Example applications may require a maximum gain variation between the CFR input and outputs. Magnitude module 615 determines the magnitude of the output of the CFR module 140 which is received on line 250. Running averaging circuit 620 then determines a running average of the output magnitude. The output of running average module 620 is received by sample and hold (S/H) circuit or module 630. The output of S/H module 630 is received by inverse module or circuit 640 where the inverse of the running average is determined. At the same time, the magnitude of input 220 is determined by magnitude module 660.

The average of the magnitude is determined by running average module 670 which is sampled by S/H module 680. The output of S/H module 680 is received by delay block 690 so that the running average of the input to the CFR module 140 and the inverse of the running average of the output of the CFR module 140 are multiplied together to determine a gain factor. That gain factor may be multiplied together in multiplier or digital gain circuit 650 to determine the gain factor which is also multiplied with the output of the CFR module 140, output 250, to maintain a constant ratio of the input/output level of the CFR module 140, which is provided on output 605 to DPD circuit 150 in this example.

FIG. 7 provides flow diagram 700 of a method of improved power amplifier efficiency through adjustments in the crest factor reduction. Flow diagram 700 pertains to the peak dynamic threshold module 230. In block 710, the signal power level of the output of the CFR module 140 is detected. In block 720, a lookup table is accessed and a value selected based on a signal power level that was detected in block 710. In block 730, the peak threshold value is updated in the CFR module 140 to achieve a substantially constant ratio between the average power and the peak power.

FIG. 8 provides flow diagram 800 of an example embodiment of a method of improved power amplifier efficiency through adjustments in the crest factor reduction. Flow diagram 800 pertains to the AGC module 240. In block 810, the continuous signal power level is determined at both the input and output of the CFR module 140. In block 820, a lookup table is accessed, and in block 830, a power level adjustment is determined from the lookup table based on the input and output power levels. In block 840, the output power level is adjusted.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A apparatus comprising:
   a crest factor reduction (CFR) module that is configured to receive an input signal;
   an automatic gain control (AGC) circuit that is coupled to the CFR module and that is configured to receive the input signal, wherein the AGC circuit is configured to automatically amplify an output of the CFR module based on the magnitude of the input of the CFR module as measured by the input magnitude module and the magnitude of the output of the CFR module; and a dynamic threshold module that is coupled to the AGC module and the CFR module, wherein the dynamic threshold module is configured to maintain a substantially fixed ratio between a peak threshold power of the input of the CFR module and an average power of the input of the CFR module, wherein the AGC circuit further comprises:
an input averaging module configured to determine a running average of the output of the input magnitude module;
an output magnitude module configured to determine a magnitude of an output of the CFR module;
an output averaging module configured to determine a running average of the output of the CFR module; and
a gain circuit configured to amplify the output of the CFR module based on the magnitude of the input of the CFR module and the magnitude of the output of the CFR module.

2. The apparatus of claim 1, wherein the AGC circuit further comprises an AGC lookup table configured for providing a gain factor based on the input and output magnitudes.

3. The apparatus of claim 1, wherein the digital threshold module comprises:
a multiplexer configured to receive the output of the input magnitude module and an output of a power meter; and
an output register configured to receive a peak threshold value from a look up table (LUT) based on an output of the multiplexer.

4. The apparatus of claim 3, wherein the peak threshold value in the output register is used by the CFR module to maintain the substantially fixed ratio between the peak threshold power of the input of the CFR module and the average power of the input of the CFR module.

5. The apparatus of claim 3, wherein a modulation accuracy of a power amplifier is held substantially constant.

6. The apparatus of claim 1, wherein the magnitude of the input to the CFR module is determined during predetermined time slots.

7. A method comprising:
receiving an input to a CFR module;
automatically amplifying the output of the CFR module to maintain a substantially constant input to output ratio for the CFR module, wherein the step of amplifying includes the steps of:
determining a running average of the magnitude of the output of the CFR module;
determining a running average of the magnitude of the input of the CFR module;
inverting the running average of the magnitude of the output of the CFR module;
multiplying the inverted average of the output of the CFR module with the running average of the input of the CFR module to determine a gain factor; and
multiplying the output of the CFR module by the gain factor; and
maintaining a substantially constant ratio between a peak output power and an average output power of the CFR module.

8. The method of claim 7, wherein automatically amplifying the output of the CFR module further comprises:
accessing an LUT based on the power levels of the input and the output of the CFR module to determine a gain factor; and
multiplying the output of the CFR module by the gain factor.

9. The method of claim 7, wherein the step of maintaining a substantially constant ratio between the peak output power and the average output power further comprises:
comparing an output power value to a plurality of threshold values;
accessing an LUT; and
determining a peak threshold value based on the comparing step.

10. The method of claim 9, wherein the method further comprises transmitting the peak threshold value to the CFR module for use in maintaining the substantially constant peak to average ratio.

11. The method of claim 7, wherein the method further comprises determining the magnitude of the input to the CRM module during predetermined time slots.

* * * * *